July 14, 1959 C. W. MUELLER 2,894,862

METHOD OF FABRICATING P-N TYPE JUNCTION DEVICES

Filed June 20, 1952

INVENTOR.
Charles W. Mueller
BY J. L. Whittaker
ATTORNEY

United States Patent Office 2,894,862

Patented July 14, 1959

2,894,862

METHOD OF FABRICATING P-N TYPE JUNCTION DEVICES

Charles W. Mueller, Princeton, N.J., assignor to Radio Corporation of America, a corporation of Delaware Application June 20, 1952, Serial No. 294,741

6 Claims. (Cl. 148—1.5)

This invention relates generally to semiconductive devices and more particularly to improved methods and means for fabricating P–N type junction devices.

It has now been found that a high resistance rectifying barrier may be formed in a solid semiconductor by the alloying and diffusion therein of a small quantity of impurity material. The impurity material is chosen such that when alloyed and diffused into a semiconductive material having one type of conductivity, for example, N-type, the impurity imparts to a localized area of the semiconductor wherein atoms from both materials are present the opposite, or P-type conductivity. It has also been found that, during the process mentioned above, some of the impurity material unduly diffuses along and/or evaporates over the surface of the semiconductor thereby creating a surface layer which bridges and substantially short-circuits the portions of the junction which are exposed at the surface of the semiconductor.

According to a further feature of the present invention, the conditions presented by this undesirable evaporation and/or surface diffusion are obviated by an improved method of fabricating semiconductive devices which includes etching the device subsequent to the formation of the junction. The etching clearly defines the high resistance junction barrier and removes any of the impurity material which may tend to short-circuit the junction thus formed.

An object of the invention is to provide an improved method of fabricating semiconductive devices.

Another object of the invention is to provide an improved method of fabricating P–N type junction devices.

Another object of the invention is to provide an improved semiconductive device in which the lifetime of the current carriers is increased.

A further object of the invention is to provide an improved method of defining portions of P–N type junctions which junction portions are exposed at the surface of a semiconductive device.

A still further object of the invention is to provide an improved method of eliminating the effects of impurity material evaporating on and/or diffusing along the surface of a semiconductior during the formation of a P–N junction.

Figure 1:
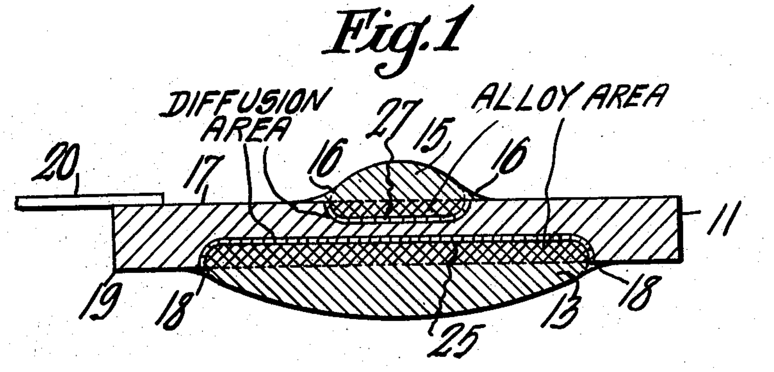
Figure 2:
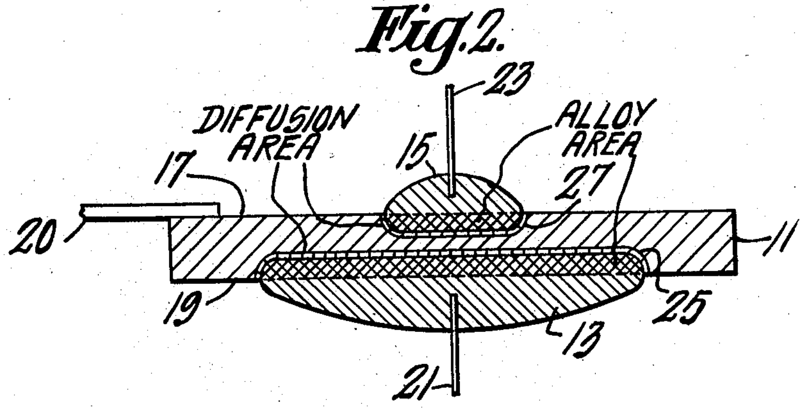

The invention will be described in greater detail with reference to the accompanying drawing in which:

Figure 1 is a schematic diagram showing a cross-section view of a junction type semiconductive device illustrating undesirable surface diffusion incident to the forming of a P–N junction by the alloy diffusion method; and Figure 2 is a view similar to that of Fig. 1 wherein the condition illustrated in Figure 1 is obviated, according to the invention.

Similar reference characters are applied to similar elements throughout the drawing.

In accordance with the present invention and referring to Figure 1, a junction type semiconductive device is fabricated in the following manner. In the present example it will be assumed that N-type germanium is the solid semiconductor utilized and that a device such as a transistor is to be fabricated. It will be recognized, however, that the method herein set forth is equally applicable to devices utilizing P-type semiconductors and to the formation of rectifier and other junction type semiconductive devices.

Initially a thin wafer 0.014" x 1/16" x 1/8" of germanium 11 is cut from a single crystal of germanium having a resistivity of from two to five ohm-centimeters. This cutting may be done by some convenient means such as by a thin diamond or silica wheel. The wafer is surface ground to a thickness of 0.010" and then etched at room temperature to a thickness of 0.006" in a solution comprising 5 cc. of 70% concentrated nitric acid, 5 cc. of 52% concentrated hydrofluoric acid, and 1 cc. distilled water. The etching solution acts on the surface of the germanium to remove scratches and to remove atoms which have been disturbed from their correct lattice positions. After etching, the wafer is washed with distilled water at room temperature and is dried in a blast of hot air at a temperature of approximately 60° C.

An impurity material such as a disk of indium 0.015" thick and 0.045" in diameter is then placed in contact with one face of the germanium wafer. Other suitable impurity materials include boron, gallium, and aluminum. Indium is especially suitable, however, and is preferred since it "wets" and alloys with germanium at a relatively low temperature whereby defects in the germanium which act as traps tending to cause conversion from N-type to P-type germanium do not occur. Furthermore, indium is soft and upon solidification no stresses are set up which may crack or damage the germanium. With a disk of indium suitably placed on the wafer 11, the ensemble is then fired in a dry hydrogen atmosphere furnace for one minute at 450° C. In this operation the indium melts and starts to alloy with the germanium. When it cools it is firmly bonded to the germanium.

A second indium disk 15 which is 0.015" in diameter is then placed on the opposite face of the germanium wafer opposite the first disk 13. At the same time a nickel tab 20, one end of which is tinned, is dipped in stannous chloride flux and is placed in contact with the germanium wafer. The unit is again fired in a dry hydrogen atmosphere, this time at a temperature of 500° C. for twenty minutes. In this operation the nickel tab 20 is soldered to the germanium wafer 11 and serves as a base connection therefor. Also, the indium disks 13 and 15 first alloy with and then diffuse into the germanium and thereby comprise the collector and emitter electrodes, respectively, of the device. The indium initially melts and alloys with the germanium lowering the melting point of the germanium. The alloying continues until the concentration of the indium in the germanium below the germanium surface is such that alloying ceases. Solid diffusion then occurs increasing the penetration of the indium into the germanium.

The above time and temperature schedules are especially suitable for the particular sizes of indium disks and thickness of germanium wafer set forth above. Other disk sizes and wafer thickness require that the schedules be slightly modified. The firing temperatures are not particularly critical since higher temperatures may be used for shorter times and vice-versa. Also, the etching time may be substantially shorter if the temperature of the etching solution is greater than room temperature.

As a result of the allowing and diffusing of atoms from the indium into the germanium, high resistance rectifying barriers 25 and 27, greatly exaggerated in size for purposes of illustration, are established around the peripheries of the diffusion areas. At the same time it will be seen that portions 16 and 18 of the indium disks diffuse along the surfaces 17 and 19 of the germanium. Also, some of the indium evaporates onto these surfaces. Thus the portion of the junction exposed at the surface of the germanium is bridged and the back impedance thereof may be substantially reduced or even short-circuited.

To clearly define the surface boundary portions of the junctions, the devices is again etched. In this instance the unit is immersed in a solution at room temperature of 10 cc. of 70% concentrated nitric acid, 10 cc. of 52% concentrated hydrofluoric acid, and 10 cc. of distilled water for thirty seconds. When the unit is immersed in the etching solution, care should be taken that the solution does not come into contact with the nickel tab 20 comprising the base connection. Such contact, if made, may cause contaminating layers to be deposited bridging the junctions thereby reducing their back impedance. After etching, the unit immediately is plunged into running hot water (60° C.) for one minute and then dried in a warm air blast.

Care also must be exercised in the etching process so that the reaction does not go to completion. If the reaction is completed and all of the acid is utilized, relatively insoluble salts are formed which are difficult to remove from the germanium. Also, these salts tend to short-circuit or greatly reduce the junction impedances.

The etching operation thus performed removes the excess indium indicated at 16 and 18 and provides a well defined area of penetration as shown in Figure 2. Also, the etching solution acts on the surface of the germanium to reduce the recombination of holes, i.e., positively charged carriers, and electrons thereby increasing the lifetime of the carrier switch, in this case, are holes. Terminal leads 21 and 23 may then be joined to the disks 13 and 15 either by soldering techniques or by pressing the leads into the indium where contact is desired. After such connections have been made, the base connection 20, and the leads 21 and 23 may be joined by spot welding or some other convenient means to a suitable socket (not shown) and the unit thus fabricated may be encased in a suitable low temperature setting plastic or resin which affords the device adequate mechanical protection.

Thus devices fabricated in accordance with the invention exhibit the characteristics of a high junction back impedance and a junction relatively free from contamination. Moreover the lifetime of the carriers is enhanced by the etching process and the finished device exhibits high gain. While the foregoing example has been directed to the fabrication of a transistor, it is clear that the method outlined hereinbefore is suitable for the manufacture of rectifier and other junction type semiconductive devices.

What is claimed is:

1. The method of fabricating a semiconductive device comprising the steps of cutting a wafer of germanium from a single germanium crystal of N-type conductivity, polishing and etching the surfaces of said wafer, melting onto one surface of said germanium wafer a quantity of an impurity material capable of imparting to a localized area of said wafer P-type conductivity, placing a second quantity of said impurity material on the opposite surface of said wafer at a point substantially opposite to said first quantity, firing said materials in a reducing atmosphere at a temperature above the melting point of said impurity materials to diffuse and alloy said impurity materials into said germanium, and etching said diffused and alloyed materials to define at said surfaces high resistance rectifying barriers formed between said wafer and said quantities of impurity materials diffused therein.

2. The method according to claim 1 wherein said impurity material is indium.

3. The method of fabricating a semiconductive device comprising the steps of cutting a wafer of germanium from a single germanium crystal of N-type conductivity, polishing and etching the surfaces of said wafer, melting onto one surface of said germanium wafer a quantity of an impurity material capable of imparting to a localized area of said wafer P-type conductivity, placing a second quantity of impurity material on the opposite surface of said wafer at a point substantially opposite said first quantity, placing an electrically conductive tab in contact with one end of said germanium wafer, firing said materials in a reducing atmosphere at a temperature above the melting point of said impurity materials to cause said impurity materials to melt and alloy with a portion of said germanium thereby to form zones of opposite conductivity type in said wafer and to bond said conductive tab thereto, etching said diffused and alloyed materials to define at said surfaces high resistance rectifying barriers formed between said wafer and said quantities of impurity materials diffused therein, and affixing separate conductive leads to said oppositely situated impurity materials.

4. A method of fabricating a semiconductor device comprising preparing a thin wafer of N-type conductivity single crystal semiconducting germanium having two opposed surfaces substantially free of atoms disturbed from their correct lattice positions, placing a thin disc of indium on one of said surfaces and firing the ensemble for a brief period of time in a dry hydrogen atmosphere at a temperature sufficient to melt the indium and cause it to begin to alloy with the germanium, placing a second thin indium disc on the opposite one of said surfaces and again firing the ensemble in a dry hydrogen atmosphere at a time and temperaure sufficient to alloy both of said indium discs into said wafer and also to cause said indium to diffuse further into the wafer.

5. A method according to claim 4 in which the thick- at a time and temperature sufficient to alloy both of said the last mentioned firing is about 20 minutes.

6. Method of fabricating a semiconductor device comprising preparing a thin wafer of single crystalline germanium of N-conductivity type, said wafer having etched and polished opposed surfaces, placing on one of said surfaces such that it covers only a portion thereof a pellet of indium, heating said wafer and pellet in a reducing atmosphere at a temperature higher than the melting point of indium to melt said pellet and cause it to adhere to said wafer, placing another indium pellet in contact with the opposite surface of said wafer and again firing the ensemble in a reducing atmosphere at a temperature high enough to melt the indium and cause it to alloy with the germanium to a desired depth, and attaching an ohmic electrode to a portion of one of said wafer surfaces not covered by said indium.

References Cited in the file of this patent

UNITED STATES PATENTS

| | | |
|---|---|---|
| 2,438,893 | Bieling | Apr. 6, 1948 |
| 2,597,028 | Pfann | May 20, 1952 |
| 2,623,102 | Shockley | Dec. 23, 1952 |
| 2,629,672 | Sparks | Feb. 24, 1953 |
| 2,631,356 | Sparks et al. | Mar. 17, 1953 |
| 2,644,852 | Dunlap | July 7, 1953 |
| 2,656,496 | Sparks | Oct. 20, 1953 |
| 2,691,750 | Shive | Oct. 12, 1954 |
| 2,701,326 | Pfann | Feb. 1, 1955 |

FOREIGN PATENTS

| | | |
|---|---|---|
| 506,110 | Belgium | Oct. 15, 1951 |
| 1,038,658 | France | Mar. 13, 1953 |